US009379686B2

(12) United States Patent
Yun et al.

(10) Patent No.: US 9,379,686 B2
(45) Date of Patent: Jun. 28, 2016

(54) RESONATOR WITH A STAGGERED ELECTRODE CONFIGURATION

(71) Applicant: QUALCOMM Incorporated, San Diego, CA (US)

(72) Inventors: Changhan Hobie Yun, San Diego, CA (US); Chengjie Zuo, Santee, CA (US); Jonghae Kim, San Diego, CA (US); Mario Francisco Velez, San Diego, CA (US); Daeik Daniel Kim, San Diego, CA (US); Rick Allen Wilcox, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 100 days.

(21) Appl. No.: 14/196,355

(22) Filed: Mar. 4, 2014

(65) Prior Publication Data
US 2015/0256143 A1    Sep. 10, 2015

(51) Int. Cl.
*H03H 9/13* (2006.01)
*H03H 9/15* (2006.01)
(Continued)

(52) U.S. Cl.
CPC ....... *H03H 9/02448* (2013.01); *H03H 9/02133* (2013.01); *H03H 9/02228* (2013.01); *H03H 9/02244* (2013.01); *H03H 9/132* (2013.01);
(Continued)

(58) Field of Classification Search
CPC .......... H03H 9/02133; H03H 9/02228; H03H 9/02244; H03H 9/02259; H03H 9/02275; H03H 9/02433; H03H 9/02448; H03H 9/132; H03H 9/133; H03H 9/462; H03H 9/54; H03H 2009/0248; H03H 2009/155; H03H 9/15

USPC .................. 333/186–189, 197, 200
See application file for complete search history.

(56) References Cited

U.S. PATENT DOCUMENTS 3,517,350 A    6/1970  William
4,894,577 A  * 1/1990  Okamoto ............... H03H 9/177
                                                  310/320

(Continued)

FOREIGN PATENT DOCUMENTS

EP    1826901 A1    8/2007
EP    1871007 A1    12/2007
WO    8200551 A1    2/1982

OTHER PUBLICATIONS

International Search Report and Written Opinion—PCT/US2015/018057—ISA/EPO—Jun. 2, 2015.

(Continued)

*Primary Examiner* — Barbara Summons
(74) *Attorney, Agent, or Firm* — Seyfarth Shaw LLP

(57) ABSTRACT

An integrated circuit device includes a piezoelectric substrate having a first surface and a second surface opposite the first surface. The device also includes a first electrode and a second electrode on the first surface of the piezoelectric substrate, the first electrode having a first width and the second electrode having a second width. The device further includes a third electrode and a fourth electrode on the second surface of the piezoelectric substrate, the third electrode having a third width that is substantially the same as the second width, and the fourth electrode having a fourth width that is substantially the same as the first width. The first and third electrodes operate as part of a first portion of a microelectromechanical systems (MEMS) resonator, and the second and fourth electrodes operate as part of a second portion of the MEMS resonator.

6 Claims, 7 Drawing Sheets

(51) Int. Cl.
  *H03H 9/54* (2006.01)
  *H03H 9/02* (2006.01)
  *H03H 9/46* (2006.01)
  *H03H 3/02* (2006.01)

(52) U.S. Cl.
  CPC ............... *H03H 9/133* (2013.01); *H03H 9/15* (2013.01); *H03H 9/462* (2013.01); *H03H 3/02* (2013.01); *H03H 9/54* (2013.01); *H03H 2003/027* (2013.01)

(56) References Cited

U.S. PATENT DOCUMENTS

| | | | |
|---|---|---|---|
| 7,098,758 B2 | 8/2006 | Wang et al. | |
| 7,227,433 B2* | 6/2007 | Ginsburg | H03H 3/0072 310/324 |
| 7,304,553 B2* | 12/2007 | Bauer | H03H 9/0042 333/193 |
| 7,372,346 B2* | 5/2008 | Tilmans | H03H 9/02102 333/187 |
| 7,429,904 B2* | 9/2008 | Trutna, Jr. | H03H 9/462 333/133 |
| 7,665,196 B2* | 2/2010 | Lee | H03H 3/08 29/25.35 |
| 7,831,210 B1* | 11/2010 | Freeman | H04B 1/0057 333/133 |
| 7,843,285 B2 | 11/2010 | Kawamura | |
| 8,138,856 B2* | 3/2012 | Khelif | H03H 3/04 333/151 |
| 8,513,863 B2* | 8/2013 | Stephanou | H03H 9/0207 310/345 |
| 2006/0284703 A1 | 12/2006 | Iwasaki et al. | |
| 2011/0008962 A1* | 1/2011 | Huang | B81C 1/00246 438/669 |
| 2012/0139665 A1 | 6/2012 | Perez et al. | |
| 2013/0134838 A1 | 5/2013 | Yun et al. | |
| 2013/0135264 A1 | 5/2013 | Black | |
| 2015/0115777 A1* | 4/2015 | Yun | H03H 9/17 310/366 |

OTHER PUBLICATIONS

Perez C.R., et al., "Bandwidth Control in Acoustically Coupled AIN Contour Mode MEMS Filters", Frequency Control Symposium, 2009 Joint With the 22nd European Frequency and Time Forum. IEEE International, IEEE, Piscataway, NJ, USA, Apr. 20, 2009, pp. 64-69, XP031492340.

* cited by examiner

RESONATOR WITH A STAGGERED ELECTRODE CONFIGURATION

TECHNICAL FIELD

The present disclosure generally relates to integrated circuits (ICs). More specifically, one aspect of the present disclosure relates to a resonator with a staggered electrode configuration.

BACKGROUND

Filters or other devices implemented in integrated circuits may use components known as resonators to generate resonant frequencies. Resonators, however, may experience the problem of spurious responses. A spurious response is any unwanted signal on a frequency other than the resonant frequency (e.g., the frequency being broadcast or received). Devices experiencing spurious frequency responses operate in spurious mode. A resonator that operates in the spurious mode creates noise and other problems in the overall circuit design of the filter, or any other device that incorporates the resonator.

The mismatch between the coefficients of thermal expansion of multiple materials making up a resonator may lead to excessive thermal stress. Undue amounts of thermal stress leads to stress imbalance, which may result in problems such as beam buckling, damage to the resonator structure, or other spurious mode irregularities.

Resonators may be acoustically coupled such that the electrical signals transmitted through the resonator are transferred electromechanically. Resonators may also extend in a lateral fashion, or be horizontally constructed. Often, such horizontal resonators have components, such as electrodes, that are symmetrically structured. Resonators may also be symmetrical and arranged in a horizontal structure, or implemented in microelectromechanical systems (MEMS). Nevertheless, such MEMS resonators may experience problems such as spurious responses, operation in the spurious mode, or thermal stress, as discussed above.

SUMMARY

In one aspect of the present disclosure, an integrated circuit device includes a piezoelectric substrate having a first surface and a second surface opposite the first surface. The device also includes a first electrode and a second electrode on the first surface of the piezoelectric substrate. The first electrode has a first width and the second electrode has a second width different from the first width. The device further includes a third electrode and a fourth electrode on the second surface of the piezoelectric substrate. The third electrode has a third width that is substantially the same as the second width. The fourth electrode has a fourth width that is substantially the same as the first width. The first electrode and the third electrode are arranged to operate as a first portion of a microelectromechanical systems (MEMS) resonator, and the second electrode and the fourth electrode are arranged to operate as a second portion of the MEMS resonator.

In another aspect, an integrated circuit device including means for supporting having a first surface and a second surface opposite the first surface. The device also includes a first electrode and a second electrode on the first surface of the supporting means, the first electrode having a first width and the second electrode having a second width different from the first width. The device further includes a third electrode and a fourth electrode on the second surface of the supporting means. The third electrode has a third width that is substantially the same as the second width. The fourth electrode has a fourth width that is substantially the same as the first width. The first electrode and the third electrode are arranged to operate as a first portion of a microelectromechanical systems (MEMS) resonator. The second electrode and the fourth electrode are arranged to operate as part of a second portion of the MEMS resonator.

In a further aspect, a method includes fabricating a first electrode of a first width and a second electrode of a second width on a first surface of a piezoelectric substrate. The second width of the second electrode is different from the first width of the first electrode. The method further includes fabricating a third electrode of a third width substantially the same as the second width, and fabricating a fourth electrode of a fourth width, substantially the same as the first width, on a second surface of the piezoelectric substrate opposite the first surface. The first electrode and the third electrode are arranged as a first aligned portion of a microelectromechanical systems (MEMS) resonator. The second electrode and the fourth electrode are arranged as a second aligned portion of the MEMS resonator.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
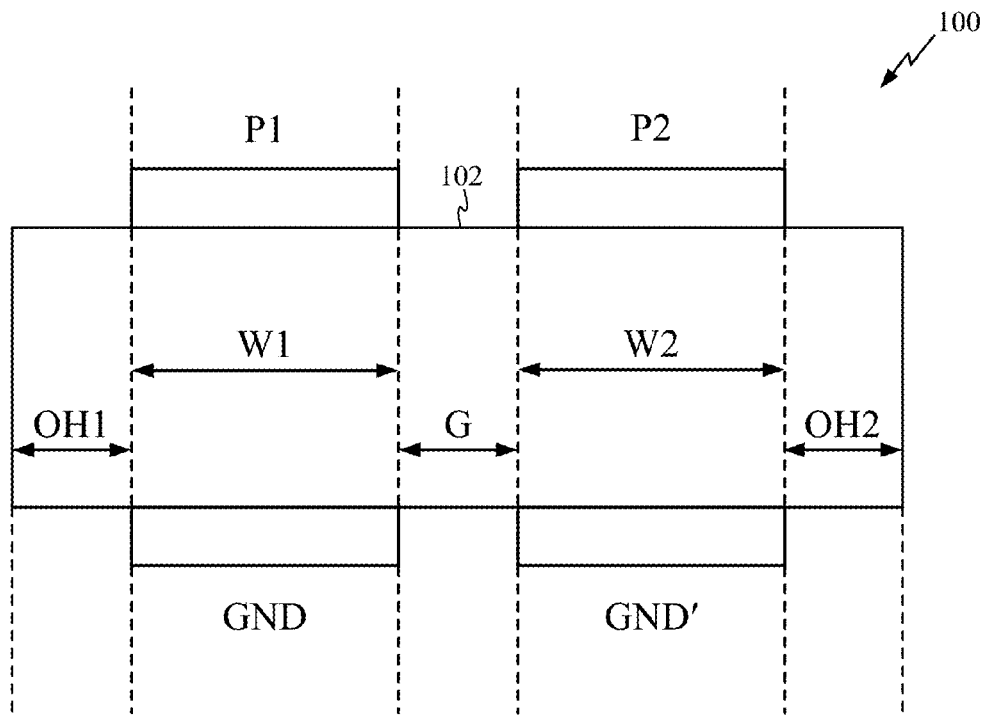
FIG. 1A is a cross-sectional view of an ideal resonator.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Resonators can be used as oscillators or as components within a filter to achieve high order frequencies. Acoustically coupled resonators are resonators in which the electrical signals flowing through the resonator are transferred acoustically or electromechanically. Many resonators are also implemented in microelectromechanical systems (MEMS). Resonators generally experience the problem of spurious responses. That is, signals at frequencies other than the resonant frequency appear in the frequency response of the resonator. This is particularly undesirable in a filter, where unwanted frequencies interfere with the filter's operation. If spurious responses continue to occur, the resonator operates in a spurious mode.

Operating in the spurious mode over time drastically reduces the quality factor, Q, and the insertion loss of a resonator, and can also lead to problems caused by thermal stress such as stress imbalance. Stress imbalance is caused by the mismatch between coefficients of thermal expansion (CTE) of different materials making up a resonator. Stress imbalance can also lead to problems such as beam buckling, which alters and deforms the structure of the resonator.

In one aspect of the disclosure, a resonator with a staggered electrode configuration is disclosed. The staggered electrodes are positioned on opposite surfaces of a piezoelectric substrate of the resonator to reduce spurious response, suppress the spurious mode and prevent problems such as stress imbalance from happening. In one configuration, the widths of the electrodes on one surface of the piezoelectric substrate are balanced with the widths of the electrodes on another surface of the piezoelectric substrate so that problems such as spurious mode and stress imbalance do not occur.

For example, a device includes a piezoelectric substrate, which may have a first surface and a second surface opposite the first surface. The device also includes a first electrode and a second electrode on the first surface of the piezoelectric substrate, the first electrode having a first width and the second electrode having a second width. The device further includes a third electrode and a fourth electrode on the second surface of the piezoelectric substrate, the third electrode having a third width that is substantially the same as the second width, and the fourth electrode having a fourth width that is substantially the same as the first width. The first and third electrodes operate as part of a first portion of a microelectromechanical systems (MEMS) resonator, and the second and fourth electrodes operate as part of a second portion of the MEMS resonator. The first portion of the MEMS resonator may be aligned somehow, and the second portion of the MEMS resonator may be aligned in order to balance out the entire resonator.

Furthermore, if an electrode with a larger size, width or weight is placed on one side (e.g., the right side) of the first surface of the piezoelectric substrate, another electrode with a substantially similar size, width or weight as this electrode may be placed on the opposite side (e.g., the left side) of the second surface of the piezoelectric substrate for balancing purposes. The same applies for electrodes with smaller sizes, widths or weights.

FIG. 1A is a cross-sectional view of an ideal resonator 100. The ideal resonator 100 cannot be achievable in the real world because every component has to be almost perfectly aligned. The ideal resonator 100 also contains a substrate 102. In addition, a first electrode P1 has a width W1 that is equivalent to a width W2 of a second electrode P2. Corresponding ground terminals GND and GND' also share the widths W1 and W2, respectively, of the first and second electrodes P1 and P2. The first overhang distance OH1 (e.g., the distance from the left edge of the first electrode P1 to the left edge of the substrate 102) is also the same as the second overhang distance OH2 (e.g., the distance from the right edge of the second electrode P2 to the right edge of the substrate 102). A gap G between the first electrode P1 and the second electrode P2 is also positioned at the exact middle of the substrate 102 so that the first and second electrodes P1 and P2 are perfectly aligned with respect to the center of the substrate 102.

Figure 1B:
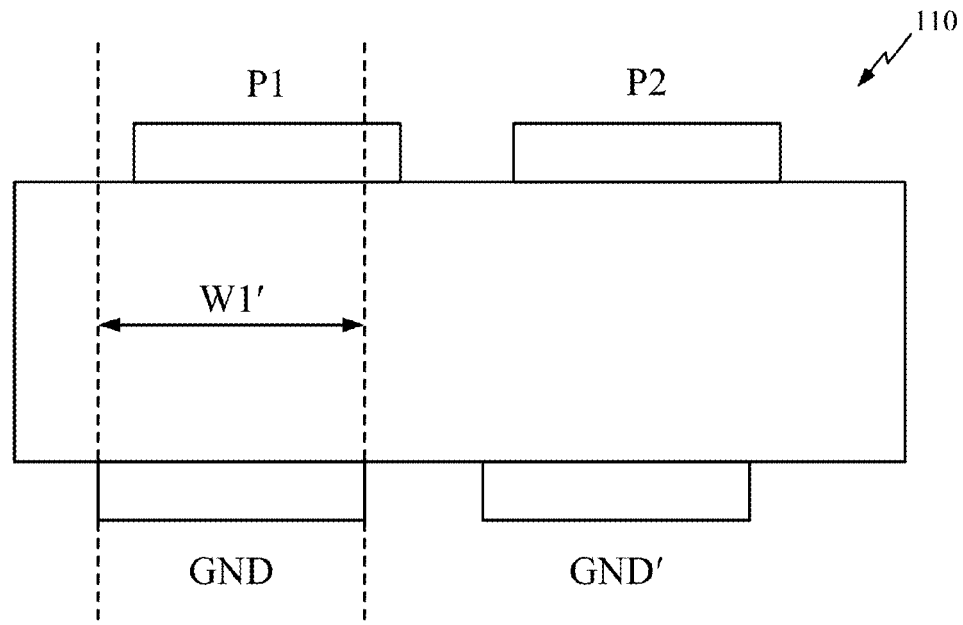
FIG. 1B is a cross-sectional view illustrating the misalignment in a typical resonator.

The ideal resonator 100 exhibits an insertion loss value of around 30 dB, with practically no spurious response. The ideal resonator 100, however, is not achievable, or is very difficult to achieve. In reality, a typical resonator 110, as shown in FIG. 1B, is misaligned when fabricated. Potential solutions that allow normal resonators to become as aligned as possible, in order to avoid spurious mode and achieve strong insertion loss, are described.

FIG. 1B is a cross-sectional view illustrating the misalignment in a typical resonator 110. The typical resonator 110 is the usual resonator that results from real world misalignment. As can be seen in FIG. 1B, the bottom left ground terminal GND is misaligned with the first electrode P1. The width W1', or the width of the bottom left ground terminal GND is now not aligned with the width of the first electrode P1. Other components, such as the bottom right ground terminal GND' and the second electrode P2, are also misaligned as a result of this misalignment with the typical resonator 110.

The typical resonator 110 leads to spurious mode and spurious responses, which drastically reduces the Q factor of the resonator. The insertion loss is also reduced by nearly half when compared to a perfectly aligned resonator such as the ideal resonator 100 of FIG. 1A. In one configuration, the insertion loss of the typical resonator 110 is roughly lower than or around 15 dB.

Figure 2A:
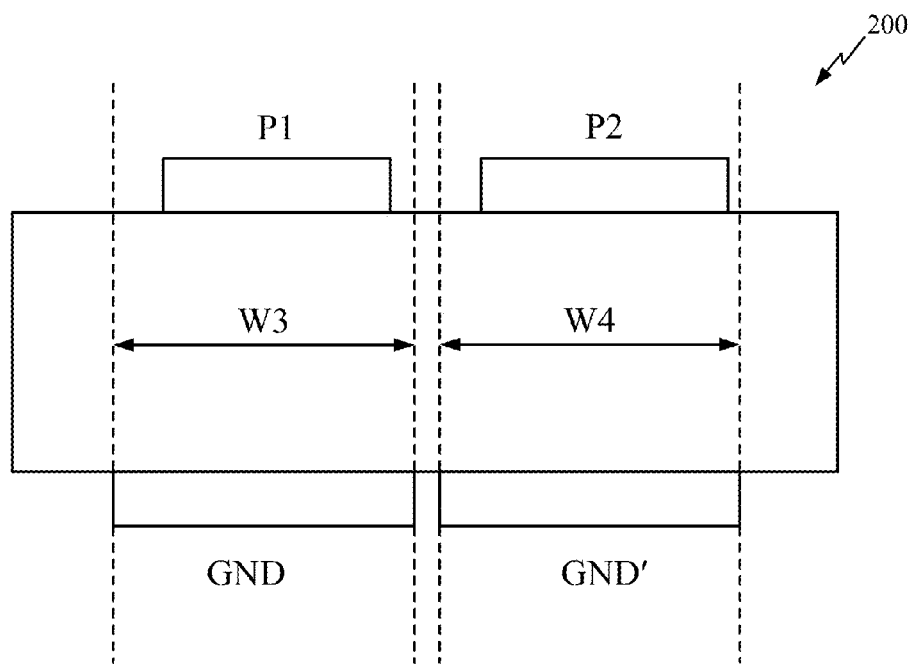
FIG. 2A is a cross-sectional view of another typical resonator.

FIG. 2A is a cross-sectional view of another typical resonator 200. The typical resonator 200 includes a potential misalignment compensation strategy used to solve the misalignment problem experienced by the typical resonator 110 in FIG. 1B. The typical resonator 200 shows two larger bottom ground electrodes GND and GND'. Therefore, the first ground terminal width W3 (e.g., the width of the bottom left ground terminal GND) is large enough to encompass any possible shift from the first electrode P1. That is, the first electrode P1 is within the width W3 of ground terminal GND, even if the first electrode P1 shifts or becomes misaligned. The same applies for the second ground terminal width W4

(e.g., the width of the bottom right ground terminal GND'), which is large enough to encompass any possible shift from the second electrode P2.

Unfortunately, spurious mode is insignificantly suppressed by the implementation of the typical resonator 200. As a result, the insertion loss of the typical resonator 200 is around 25 dB.

The typical resonator 200 can lead to the serious problem of stress imbalance. Stress imbalance is caused by a mismatch between the coefficients of thermal expansion (CTE) between the materials that make up a resonator's composition, (e.g., aluminum nitride (AlN) and molybdenum (Mo)). For example, the coefficient of thermal expansion for aluminum nitride is 4.6 parts per million per centigrade degree (ppm), and the coefficient of thermal expansion for molybdenum is 7.1 ppm.

The curvature, κ, of a system composed of a thin film of thickness $h_f$ deposited on a much thicker substrate of thickness $h_s$ can be defined by equation (1) as follows:

$$\kappa = \frac{\sigma_f \cdot h_f \cdot (1-v)}{(h_s)^2 \cdot E} \quad (1)$$

Where $\sigma_f$ is the film stress, $h_f$ is the film thickness, v is the substrate's Poisson ratio, $h_s$ is the substrate's thickness and E is the substrate's Young's modulus. Equation (1) can be applied to the typical resonator 200, where larger bottom electrodes are used to compensate for any misalignment between the top electrodes. Due to the higher coefficient of thermal expansion (CTE) of the material within the bottom electrode, which is also wider (and usually molybdenum), the overall beam of the resonator becomes a convex bulge and looks "buckled up." This beam buckling phenomena is shown in FIG. 2B.

Figure 2B:
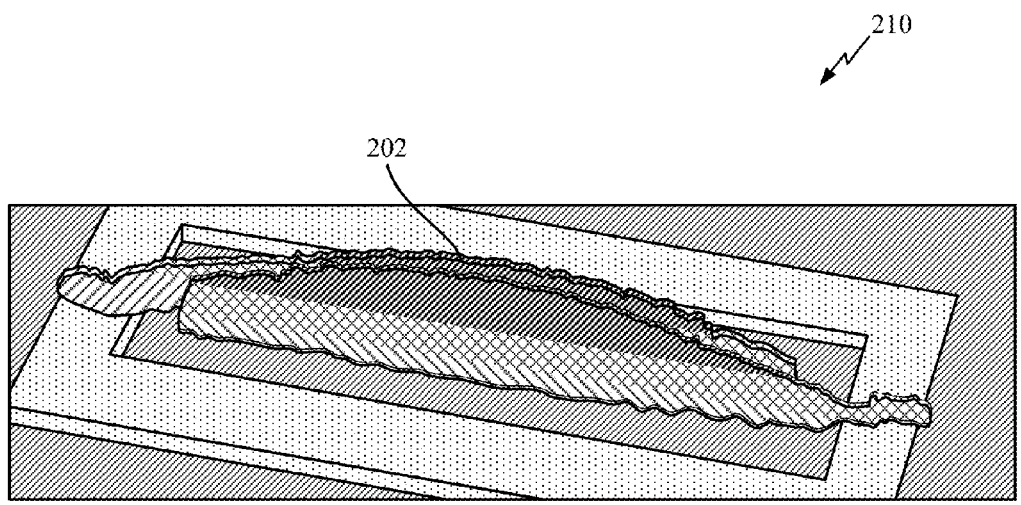
FIG. 2B is a three-dimensional view of a typical resonator undergoing beam buckling.

FIG. 2B is a three-dimensional view 210 of a typical resonator 202 that exhibits beam buckling. The typical resonator 202 is the typical resonator 200 after undergoing beam buckling. Three-dimensional view 210 shows the typical resonator 202 after experiencing beam buckling due to thermal stress imbalance and a mismatch between the materials making up the typical resonator 202 (e.g., aluminum nitride (AlN) and molybdenum (Mo)). This completely deforms the resonator beam and also ruins the structure of the resonator. In this example, the insertion loss experienced is around 15 dB or less at the point beam buckling occurs. There is also a spurious mode irregularity in the spurious response when beam buckling occurs.

Figure 3:
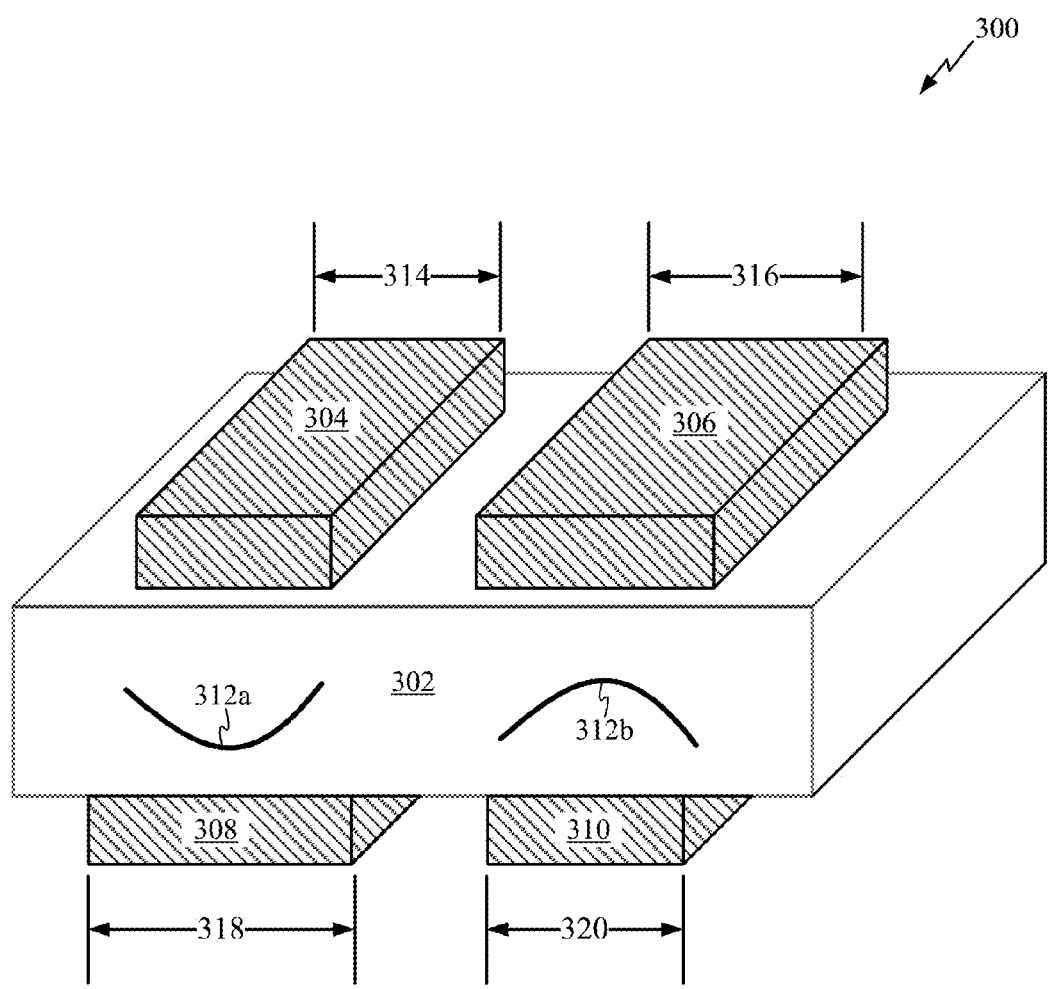
FIG. 3 is a perspective view of a staggered electrode resonator, according to an aspect of the present disclosure.

FIG. 3 is a perspective view of a staggered electrode resonator 300, according to an aspect of the present disclosure. The staggered electrode resonator 300 includes a first electrode 304 having a first width 314 and a second electrode 306 having a second width 316 on a first surface of a substrate 302. The staggered electrode resonator 300 also includes a third electrode 308 having a third width 318 and a fourth electrode 310 having a fourth width 320 on a second surface of the substrate 302. A first portion curvature 312a shows the curvature of a first portion of the staggered electrode resonator 300 buckling down. In addition, a second portion curvature 312b shows the curvature of a second portion of the staggered electrode resonator 300 buckling up.

In one configuration, the first width 314 is substantially similar to or nearly the same as the fourth width 320, and the second width 316 is substantially similar to or nearly the same as the third width 318. In this configuration, staggering electrodes having substantially similar widths (and likely other similar properties) at opposite ends of opposite surfaces of a substrate, provides a balanced resonator that eliminates thermal stress issues and increases insertion loss. The resulting balanced structure of the staggered electrode resonator 300 is also an even, stable structure with very low stress.

In one configuration, if the first width 314 and the fourth width 320 can be expressed as W1, and the second width 316 and the third width 318 can be expressed as W2, then the following equation may be satisfied to achieve greater than 30 dB insertion loss or noise suppression: 0.2 μm<|W1−W2|<0.8 μm. In another configuration, the staggered electrode resonator 300 achieves an insertion loss of 35 dB or higher, which substantially exceeds the insertion loss achieved by the ideal resonator 100 of FIG. 1A (e.g., by some estimates approaching 30 dB).

In one configuration, the staggered electrode resonator 300 is a microelectromechanical systems (MEMS) resonator. In this configuration, the first electrode 304 and the second electrode 306 are input and output, respectively, of the staggered electrode resonator 300. In addition, the third electrode 308 and the fourth electrode 310 are ground electrodes of the staggered electrode resonator 300. In another configuration, the first electrode 304 and the second electrode 306 are ground electrodes of the staggered electrode resonator 300. In addition, the third electrode 308 and the fourth electrode 310 are input and output, respectively, of the staggered electrode resonator 300. In another configuration, the first electrode 304 and the third electrode 308 are input and output, respectively, of the staggered electrode resonator 300. In addition, the second electrode 306 and the fourth electrode 310 are ground electrodes of the staggered electrode resonator 300. In another configuration, the first electrode 304 and the fourth electrode 310 are input and output, respectively, of the staggered electrode resonator 300. In addition, the second electrode 306 and the third electrode 308 are ground electrodes. In another configuration, the second electrode 306 and the third electrode 308 are input and output, respectively, of the staggered electrode resonator 300. In addition, the first electrode 304 and the fourth electrode 310 are ground electrodes.

In one configuration, there may be further electrodes such as a fifth electrode, a sixth electrode, a seventh electrode and an eighth electrode (e.g., having different width configurations) to balance out with the first electrode 304, the second electrode 306, the third electrode 308 and the fourth electrode 310.

Figure 4A:
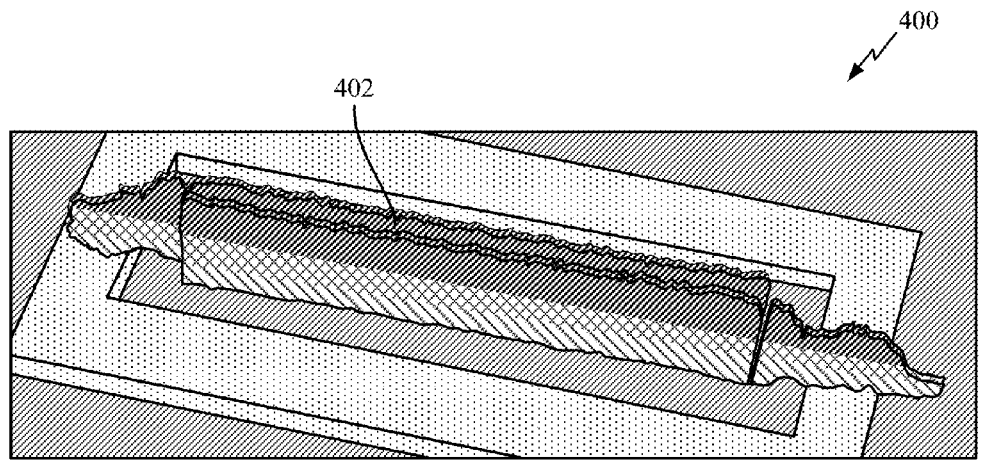
FIG. 4A is a three-dimensional view of a staggered electrode resonator, according to an aspect of the present disclosure.

FIG. 4A is a three-dimensional view 400 of a staggered electrode resonator 402, according to an aspect of the present disclosure. As can be seen by the three-dimensional view 400, the staggered electrode resonator 402 is a relatively even and stable structure with low thermal stress and no stress imbalance. Therefore, no beam buckling occurs in the staggered electrode resonator 402. The staggered electrode resonator 402 may also be stronger and more robust than the typical resonator 200 shown in FIG. 2A or the typical resonator 202 that incurs beam buckling in FIG. 2B.

Figure 4B:
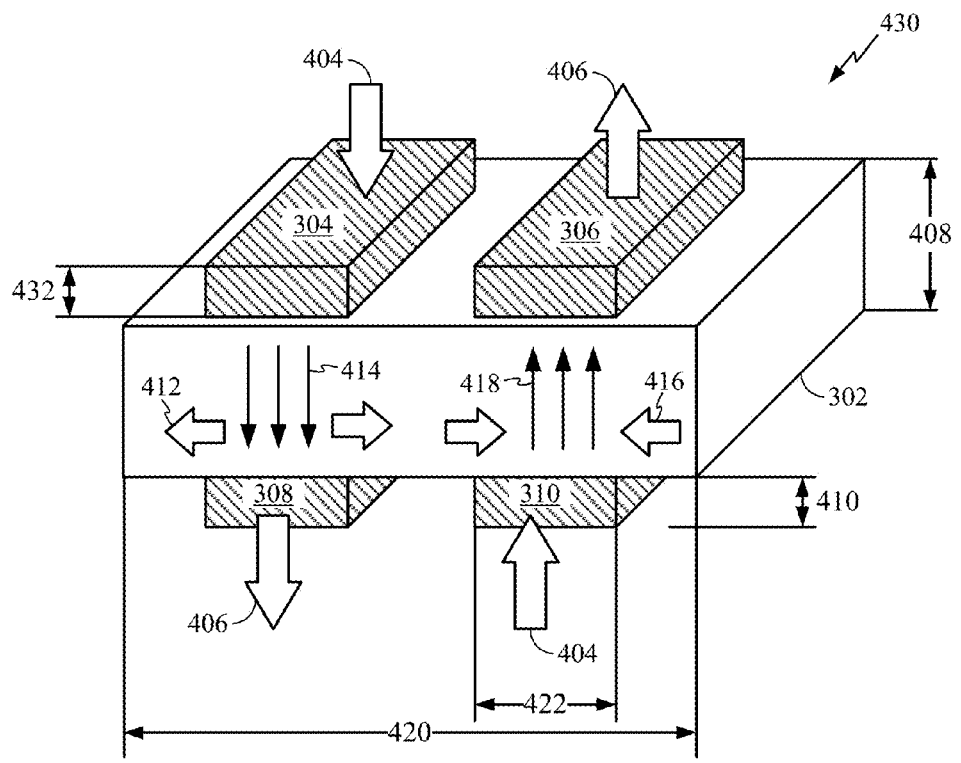
FIG. 4B is a more detailed perspective view of a staggered electrode resonator, according to an aspect of the present disclosure.

FIG. 4B is a more detailed perspective view of a staggered electrode resonator 430, according to an aspect of the present disclosure. For the sake of explanation, microelectromechanical systems (MEMS) resonators are described, although the present disclosure applies to other types of resonators, as well. The staggered electrode resonator 430 includes a substrate 302. In one configuration, the substrate 302 is made of piezoelectric materials such as aluminum nitride (AlN) and its alloys, such as those doped with boron (B), chromium (Cr), erbium (Er) or scandium (Sc); zinc oxide (ZnO); lithium niobate (LiNbO$_3$), lithium tantalate (LiTaO$_3$), lead zirconate titanate or PZT (Pb[Zr$_x$Ti$_{1-x}$]O$_3$ 0≤x≤1), quartz (SiO$_4$ or SiO$_2$) crystals, and topaz (Al$_2$SiO$_4$(F,OH)$_2$) crystals. The substrate 302 may also be made of other like materials having a mechanical structure that can be stimulated in an electrical fashion through electromechanical coupling.

The staggered electrode resonator 430 has a first electrode 304, a second electrode 306, a third electrode 308 and a fourth electrode 310. In one configuration, the first electrode 304, the second electrode 306, the third electrode 308 and the fourth electrode 310 are made of materials including molybdenum (Mo), platinum (Pt), copper (Cu), aluminum (Al), silver (Ag), gold (Au), tungsten (W), nickel (Ni), or other like conductive materials. A first signal 404 may be coupled to the first electrode 304, and a second signal 406 may be coupled to the second electrode 306. The first signal 404 is also coupled to the fourth electrode 310, and the second signal 406 is also coupled to the third electrode 308. In one configuration, the first signal 404 may be an electrical input signal and the second signal 406 may be an electrical output signal. The first electrode 304, the second electrode 306, the third electrode 308 and the fourth electrode 310 may be on any surface of the substrate 302 including top surfaces, bottom surfaces, and side surfaces.

Any of the electrodes 304, 306, 308 and 310 may be a ground terminal. In one configuration, the ground terminal is coupled to a voltage ground or source supply voltage (Vss). Each ground terminal may also be separated into two or more separate ground terminals, which can be positioned on any surface of the substrate 302.

The staggered electrode resonator 430 operates via a first electrical field 414, a first mechanical displacement 412, a second mechanical displacement 416 and a second electrical field 418. The first mechanical displacement 412 and the second mechanical displacement 416 represent directions of mechanical displacement that occur within the staggered electrode resonator 430 when signals are present on the electrodes. The first electrical field 414 and the second electrical field 418 represent the direction of the electrical field through the staggered electrode resonator 430.

As can be seen by FIG. 4B, there are different directional freedoms for both the electrical field and the mechanical displacement. The first direction is expansion. That is, the first signal 404 (e.g., an input signal) is fed into the first electrode 304 (which may act as an input electrode), which generates the first electrical field 414, which is then in turn translated into the first mechanical displacement 412 that flows outward and expands a region of the substrate 302.

The second direction is contraction. That is, the second mechanical displacement 416 translates an inward, contracting mechanical displacement from a region of the substrate 302 into the second electrical field 418, which flows into the second electrode 306 (which may act as an output electrode) and becomes dispelled as the second signal 406 (e.g., an output signal). The same process applies for the first signal 404 input into the fourth electrode 310, and the second signal 406 output from the third electrode 308. The transfer and translation of the electrical field to a mechanical displacement is due to the electromechanical coupling resonance caused by the piezoelectric effect.

The expansion and contraction directions counteract each other to maintain constant parameters in the staggered electrode resonator 430, such as a constant resonant frequency. Also, by changing the position or width of the electrodes 304, 306, 308 and 310 on any surfaces of the substrate 302, the parameters of the staggered electrode resonator 430 are modified and may be adjusted to meet particular design specifications.

In one configuration, the staggered electrode resonator 430 is a microelectromechanical systems (MEMS) resonator. In this configuration, the first electrode 304 and the second electrode 306 are input and output, respectively, of the staggered electrode resonator 430. In addition, the third electrode 308 and the fourth electrode 310 are ground electrodes of the staggered electrode resonator 430. In another configuration, the first electrode 304 and the second electrode 306 are ground electrodes of the staggered electrode resonator 430. In addition, the third electrode 308 and the fourth electrode 310 are input and output, respectively, of the staggered electrode resonator 430.

In another configuration, the first electrode 304 and the third electrode 308 are input and output, respectively, of the staggered electrode resonator 430. In addition, the second electrode 306 and the fourth electrode 310 are ground electrodes of the staggered electrode resonator 430. In another configuration, the first electrode 304 and the fourth electrode 310 are input and output, respectively, of the staggered electrode resonator 430. In addition, the second electrode 306 and the third electrode 308 are ground electrodes of the staggered electrode resonator 430. In another configuration, the second electrode 306 and the third electrode 308 are input and output, respectively, of the staggered electrode resonator 430. In addition, the first electrode 304 and the fourth electrode 310 are ground electrodes of the staggered electrode resonator 430.

In one configuration, there may be further electrodes such as a fifth electrode, a sixth electrode, a seventh electrode and an eighth electrode, each having different width configuration. The fifth electrode, a sixth electrode, a seventh electrode and an eighth electrode are arranged in balance with the first electrode 304, the second electrode 306, the third electrode 308 and the fourth electrode 310, respectively. The staggered electrode resonator 430 may also be expanded in any direction where additional electrodes may be added. The staggered electrode resonator 430 may also add on additional fingers or electrodes to the overall structure.

The staggered electrode resonator 430 also contains a first electrode thickness 432, a substrate thickness 408, a fourth electrode thickness 410, a fourth electrode width 422 and a substrate width 420. Example values for the first electrode thickness 432 and the fourth electrode thickness 410 may range from about 100 nm to 400 nm. Example values for the substrate thickness 408 may range from about 0.5 µm to 5 µm. Example values for the fourth electrode width 422 may range from about 300 nm to 1.2 µm. Example values for the substrate width 420 may range from about 1.5 µm to 15 µm.

In one configuration, the first electrode thickness 432 is substantially similar to the fourth electrode thickness 410. In another configuration, the first electrode thickness 432 and the fourth electrode thickness 410 is the thickness of a molybdenum (Mo) layer. In one configuration, the substrate thickness 408 is the thickness of an aluminum nitride (AlN) layer. In this configuration, the substrate width 420 is the thickness of an aluminum nitride (AlN) layer.

Figure 5:
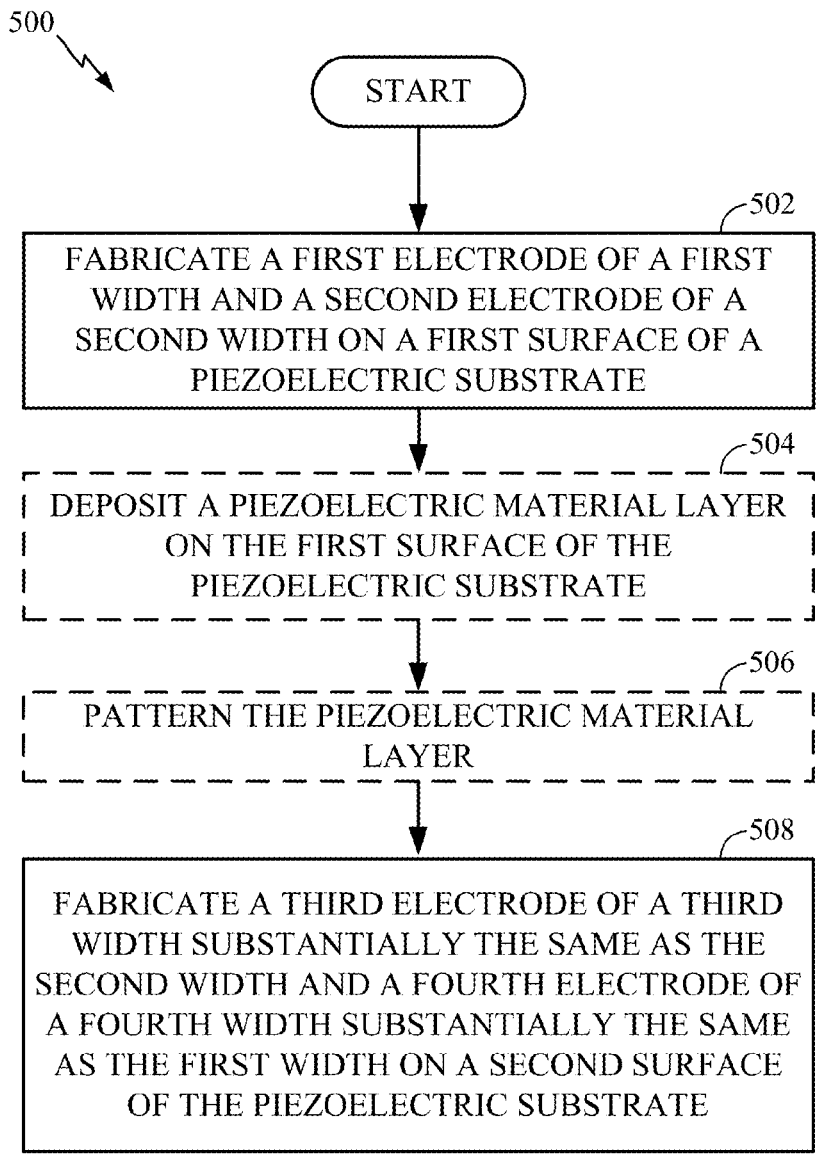
FIG. 5 is a process flow diagram illustrating a process of making a staggered electrode resonator according to an aspect of the present disclosure.

FIG. 5 is a process flow diagram illustrating a process 500 of fabricating a staggered electrode resonator according to an aspect of the present disclosure. In block 502, a first electrode (e.g., the first electrode 304) of a first width (e.g., the first width 314) and a second electrode (e.g., the second electrode 306) of a second width (e.g., the second width 316) are fabricated on a first surface of a piezoelectric substrate (e.g., the substrate 302). In block 504, a piezoelectric material layer is deposited on the first surface of the piezoelectric substrate. In block 506, the piezoelectric material layer is patterned.

Blocks 504 and 506 are shown with dotted line borders to indicate that they may be optionally performed in process 500.

In block 508, a third electrode (e.g., the third electrode 308) of a third width (e.g., the third width 318) substantially the same as the second width and a fourth electrode (e.g., the fourth electrode 310) of a fourth width (e.g., the fourth width 320) substantially the same as the first width are fabricated on the second surface of the piezoelectric substrate. The first and third electrodes are arranged as a first portion of a microelectromechanical systems (MEMS) resonator (e.g., the staggered electrode resonator 300 or the staggered electrode resonator 430). The second and fourth electrodes are arranged as a second portion of the MEMS resonator. In one configuration, the first portion and the second portion of the MEMS resonator may be aligned in that the first aligned portion contains the first and third electrodes aligned together. Similarly, the second aligned portion contains the second and fourth electrodes aligned together.

The process 500 may also include depositing another piezoelectric material layer (e.g., a second piezoelectric material layer, if the piezoelectric material layer deposited on the first surface of the piezoelectric substrate is referred to as the first piezoelectric material layer) on the second surface of the piezoelectric substrate. The process 500 may additionally include patterning that other piezoelectric material layer (or the second piezoelectric material layer) after it has been deposited on the second surface of the piezoelectric substrate. In one configuration, any of the piezoelectric material layers are deposited over any of the electrodes (e.g., the first through fourth electrodes) when they are deposited on any surface of the piezoelectric substrate that already contains electrodes.

In the process 500, fabricating the first electrode of the first width and the second electrode of the second width may be performed as follows. Initially, a conductive layer is deposited on the first surface of the piezoelectric substrate. The depositing conductive layer is then patterned to form the first electrode and the second electrode from the deposited conductive layer. The conductive layer may be made of materials including Molybdenum (Mo), Platinum (Pt), Copper (Cu), Aluminum (Al), Silver (Ag), Gold (Au), Tungsten (W), Nickel (Ni), or other like materials. The conductive layer may be deposited onto the piezoelectric substrate by electroplating, chemical vapor deposition (CVD), and/or physical vapor deposition (PVD), such as sputtering or evaporation.

In an aspect of the present disclosure, patterning of the deposited conductive layer to form the first electrode and the second electrode may be performed as follows. A photoresist layer is initially depositing on the deposited conductive layer. The deposited photoresist layer is then exposed with light through a photolithography mask. The exposed portions of the photoresist layer are then etching away to form a photoresist pattern. Subsequently, the photoresist pattern is used guide etching of the deposited conductive layer to form the first electrode and the second electrode.

The light may be an ultraviolet light or deep ultraviolet light. The photoresist layer may be deposited by spin-coating, droplet-based photoresist deposition, and/or spraying. The exposed portions of the photoresist layer may be etched away using a chemical etching processes. This process may use solutions such as a photoresist developer, which may be made of, for example, tetramethylammonium hydroxide (TMAH), iron chloride ($FeCl_3$), cupric chloride ($CuCl_2$) or alkaline ammonia ($NH_3$). Dry etching processes using plasmas may also be used to etch the first photoresist layer. The conductive layer is then patterned by any wet chemical or dry etching process, with the etched photoresist regions of the first photoresist layer (e.g., the photoresist pattern) being used to guide the etch process. The remaining portions of the first photoresist layer may then be stripped by a chemical photoresist stripping process using a photoresist stripper such as, for example, positive resist stripper (PRS-2000), n-methyl-2-pyrrolidone (NMP), or acetone. The photoresist layers may also be stripped by a dry photoresist stripping process using plasmas such as oxygen, which is known as ashing.

Also, the process 500 may include depositing a conductive layer on the second surface of the piezoelectric substrate to enable fabrication of the third electrode of the third width and the fourth electrode of the fourth width. The deposited, conductive layer may be patterned to form the third electrode and the fourth electrode.

In an aspect of the present disclosure, patterning of the third electrode and the fourth electrode from the deposited conductive layer may be performed as follows. A photoresist layer may be initially depositing on the deposited conductive layer. The photoresist layer is then exposed with light using a photolithography mask. The exposed portions of the photoresist layer is then etching away to form a photoresist pattern. Subsequently, the photoresist pattern is used as a guide to etch the deposited conductive layer to form the third electrode and the fourth electrode. Example substances and processes used to fabricate the third electrode and the fourth electrode are similar to the substances and processed used to fabricate the first electrode and the second electrode, as discussed above.

In one aspect, an integrated circuit device includes a means for supporting having a first surface and a second surface opposite the first surface. The device also includes a first electrode and a second electrode on the first surface of the supporting means. In this configuration, the first electrode has a first width and the second electrode having a second width different from the first width. The device further includes a third electrode and a fourth electrode on the second surface of the supporting means. The third electrode has a third width that is substantially the same as the second width. In addition, the fourth electrode has a fourth width that is substantially the same as the first width. The first electrode and third electrode may be arranged to operate a first portion of a microelectromechanical systems (MEMS) resonator. In addition, the second electrode and the fourth electrode may be arranged to operate as a second portion of the MEMS resonator. In one configuration, the supporting means may be the substrate 302, which may be composed of a piezoelectric material, a ceramic material or other like material to provide support for the electrodes and other components of a staggered electrode resonator.

Both stress control methods and structures to achieve stress control are disclosed. Also, both spurious mode suppression methods and structures to achieve spurious mode suppression are disclosed. Any relevant piezoelectric materials may be used in the substrate and other components discussed above. Also, all different types of conductive material (e.g., metals) may be used for the electrodes, as the thermal coefficients of expansion of metals are usually higher than those of piezoelectric, ceramic or other like substrate materials. In one configuration, the first electrode and the second electrode may be fabricated at a first conductive layer (e.g., metal 1 (M1)). In this configuration, the third electrode and the fourth electrode may be fabricated at a second conductive layer (e.g., metal 2 (M2)).

Figure 6:
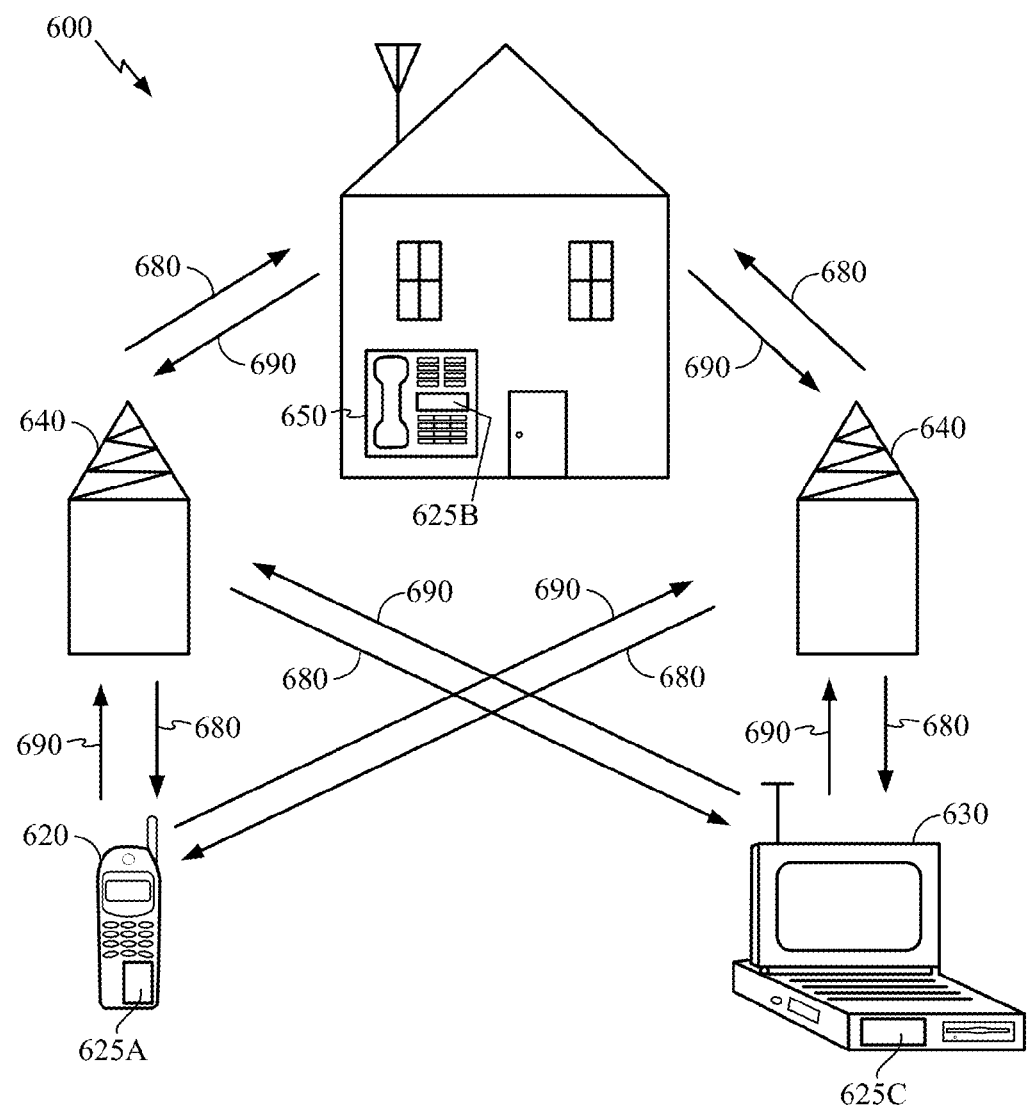
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed staggered electrode resonators. It will be recognized that other devices may also include the disclosed staggered electrode resonators, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed staggered electrode resonators.

Figure 7:
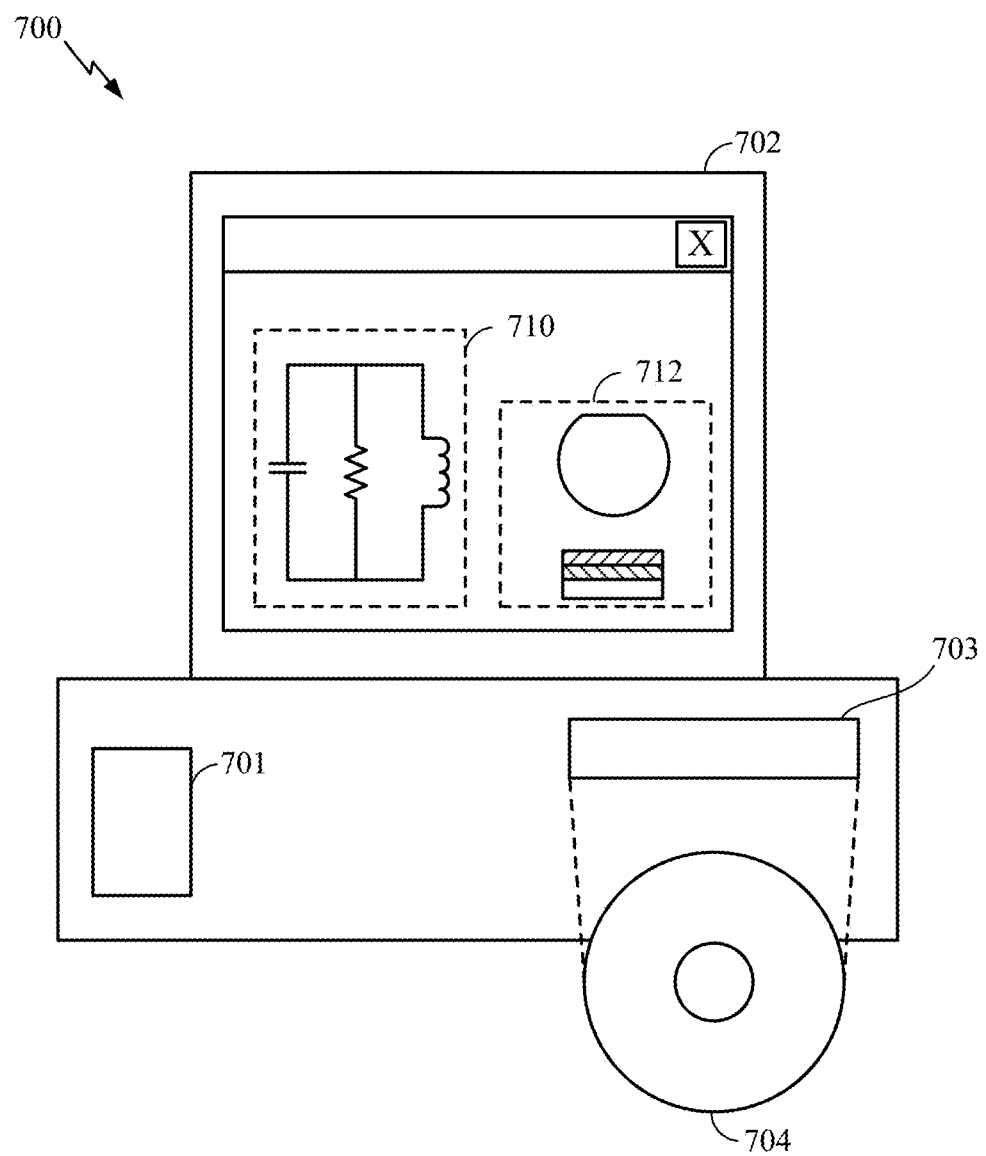
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the staggered electrode resonators disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a staggered electrode resonator. A storage medium 704 is provided for tangibly storing the design of circuit 710 or the semiconductor component 712. The design of the circuit 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit device, comprising:
   a piezoelectric substrate having a first surface and a second surface opposite the first surface;
   a first electrode and a second electrode on the first surface of the piezoelectric substrate, the first electrode having a first width and the second electrode having a second width different from the first width; and
   a third electrode and a fourth electrode on the second surface of the piezoelectric substrate, the third electrode having a third width that is substantially the same as the second width, the fourth electrode having a fourth width that is substantially the same as the first width,
   the first electrode and the third electrode being aligned on a same side of the first surface and the second surface of the piezoelectric substrate and arranged to operate as a first portion of a microelectromechanical systems (MEMS) resonator, in which one of the first electrode and the third electrode is an input electrode and the other electrode is either an output electrode or a ground electrode, and the second electrode and the fourth electrode being aligned on a same side of the first surface and the second surface of the piezoelectric substrate and arranged to operate as a second portion of the MEMS resonator, in which one of the second electrode and the fourth electrode is an input electrode and the other electrode is either an output electrode or a ground electrode.

2. The integrated circuit device of claim 1, in which the first electrode and the second electrode are the input electrode and the output electrode, respectively, of the MEMS resonator, and the third electrode and the fourth electrode are the output electrode and the input electrode of the MEMS resonator.

3. The integrated circuit device of claim 1 integrated into a mobile phone, a set top box, a music player, a video player, an entertainment unit, a navigation device, a computer, a handheld personal communication systems (PCS) unit, a portable data unit, and/or a fixed location data unit.

4. An integrated circuit device, comprising:
means for supporting having a first surface and a second surface opposite the first surface;
a first electrode and a second electrode on the first surface of the supporting means, the first electrode having a first width and the second electrode having a second width different from the first width; and
a third electrode and a fourth electrode on the second surface of the supporting means, the third electrode having a third width that is substantially the same as the second width, the fourth electrode having a fourth width that is substantially the same as the first width,
the first electrode and the third electrode being aligned on a same side of the first surface and the second surface of the supporting means and arranged to operate as a first portion of a microelectromechanical systems (MEMS) resonator, in which one of the first electrode and the third electrode is an input electrode and the other electrode is either an output electrode or a ground electrode, and the second electrode and the fourth electrode being aligned on a same side of the first surface and the second surface of the supporting means and arranged to operate as part of a second portion of the MEMS resonator, in which one of the second electrode and the fourth electrode is an input electrode and the other electrode is either an output electrode or a ground electrode.

5. The integrated circuit device of claim 4, in which the first electrode and the second electrode are the input electrode and the output electrode, respectively, of the MEMS resonator, and the third electrode and the fourth electrode are the output electrode and the input electrode of the MEMS resonator.

6. The integrated circuit device of claim 4 integrated into a mobile phone, a set top box, a music player, a video player, an entertainment unit, a navigation device, a computer, a handheld personal communication systems (PCS) unit, a portable data unit, and/or a fixed location data unit.

\* \* \* \* \*